United States Patent [19]

Bryant et al.

[11] Patent Number: 4,638,442

[45] Date of Patent: Jan. 20, 1987

[54] COMPUTER AIDED DESIGN METHOD AND APPARATUS COMPRISING MEANS FOR AUTOMATICALLY GENERATING PIN-TO-PIN INTERCONNECTION LISTS BETWEEN RESPECTIVE DISCRETE ELECTRICAL COMPONENT CIRCUITS

[75] Inventors: Stewart F. Bryant, Redhill; Stephen J. Baker, Brighton; Richard A. Cook, Haywards Heath, all of England

[73] Assignee: U.S. Philips Corporation, New York, N.Y.

[21] Appl. No.: 669,207

[22] Filed: Nov. 6, 1984

[30] Foreign Application Priority Data

Nov. 9, 1983 [GB] United Kingdom ................ 8329888

[51] Int. Cl.[4] ............................................ G06F 15/60
[52] U.S. Cl. .................................................. 364/489
[58] Field of Search ....................... 364/488, 489, 490

[56] References Cited

U.S. PATENT DOCUMENTS 3,567,914 3/1971 Neese et al. .................... 364/489 X Primary Examiner—Michael L. Gellner
Attorney, Agent, or Firm—Jack E. Haken; James J. Cannon, Jr.

[57] ABSTRACT

Computer aided design method and apparatus which automatically generate pin-to-pin interconnection lists between respective discrete electrical component circuits. Input devices provide for entering a list of components used, a description of those components and the circuit interconnection description. The memory store contains a library of standard component descriptions. A processing unit process the entered circuit description and selected component descriptions from storage to produce an interconnection list in the form of an individual component pin to individual component pin connection.

9 Claims, 3 Drawing Figures

COMPUTER AIDED DESIGN METHOD AND APPARATUS COMPRISING MEANS FOR AUTOMATICALLY GENERATING PIN-TO-PIN INTERCONNECTION LISTS BETWEEN RESPECTIVE DISCRETE ELECTRICAL COMPONENT CIRCUITS

BACKGROUND OF THE INVENTION

The invention relates to a computer aided design method and apparatus comprising means for automatically generating pin-to-pin interconnection lists between respective discrete electrical component circuits. An example of a computer aided design/assembly package is the RACAL REDAC Mini/Maxi PCB Design System, described in the Data Preparation Manual by the Technical Writing Group from the manufacturer, RACAL REDAC Ltd., Newton, Tewkesbury, Gloucestershire, GL 20 8HE, England.

OBJECT AND GENERAL ASPECTS

The invention is particularly applicable in the design of printed circuit boards, although the technology of the interconnection between the discrete circuits may be effected by electrical connections, fiber optics or other ways. The problem addressed by the invention occurs when the electrical circuit has been drawn on the level of discrete elements, ranging from transistors, resistors and capacitors, via gates, registers, and the like, and sometimes up to VLSI microprocessors. Thereafter, the realization must be effected from a limited selection of standard circuits or modules. The output of the above-mentioned apparatus may be used directly in a further machine stage of a computer aided design system. Similar conditions apply when producing interconnection lists for wire wrapped circuit boards where the lists are used be persons performing the wire wrapping or are fed to an automatic wire wrapping machine.

The present state of the art is exemplified by an article HISDL-A structure description language; by W. Y. P. Lim, Communications of the ACM, Vol. 25, No. 11, November 1982, pages 823–830. The inventors of the present invention have realized that the inputting of the circuit interconnection description should be made as straightforward as possible. One of the improvements therefore is the provision for arrays of named components; in practice certain components, notably memory components are used array-wise to enlarge the circuit's capacity. The invention provides a solution in that it provides an arrangement for generating a component interconnection list for an electrical circuit, each interconnection being in the form of a link between a first individual component pin and a second individual component pin, said arrangement comprising means for entering a component list containing any component used,
a component description of any component used inclusive of a functional pin description thereof, and
a circuit interconnection description containing elements of the form of a first array of pins of a second array of named components connected to a third array of pins of a fourth array of named components, at least one array being non-unitary, wherein for any circuit interconnection description element in which both said first and said third arrays are non-unitary the first and third arrays have equal numbers of array elements, said arrangement furthermore containing library means for storing said component descriptions as standard component descriptions, processing means for processing, under program control, the circuit interconnection description and the list of components used while addressing said library means for accessing said component descriptions, and output means for after said processing outputting said component interconnection list.

Herein, a unitary array is defined as an array having only a single element. Thus, the invention provides an automatic facility for interconnecting arrays, no specifying of a loop being necessary. The present realization is particularly advantageous because bus-type interconnections are usually specified on a 1-to-1 basis inclusive an offset quantity. The present invention is specifically data-oriented. The interconnection description may be in the form of:

$$X[a:b].A[c:d], Y[e:f].B[g:h];$$

where
X and Y are component pin function descriptions,
A and B are component means,
a, b, c, d, e, f, g, and h are integers or letters which may take any value provided that the difference between a and b is equal to the difference between e and f unless either of those differences is equal to zero in which case the other may take any value, the dot (.) represents "belonging to", and the comma represents "is connected to".

A frequent requirement is that of connecting a number of components to an n-bit address or data bus, where n is an arbitrary number but typically eight or sixteen. The components may be, for example memory devices, microprocessors, registers, buffers, etc. Different manufacturers of these devices use different conventions to define the significance of each bit on the address or data bus. Thus for example in an 8 bit data one manufacturer may designate the most significant bit D0 and the least significant D7 while another manufacturer reverses this convention and uses D7 for the most significant bit. If a circuit is designed using components from two different manufacturers a cross connection has to be specified and this frequently gives a rise to errors in specifying the connections. The arrangement according to the invention includes a store holding a library of component descriptions which can be accessed by a computer and into which component descriptions can be inserted and from which previously stored descriptions can be accessed. In one form the invention enables the use of a simpler interconnection description by allowing the entry of a component interconnection description in the form $$D[1:n].A, D[n:1].B; \qquad (1)$$

This description is interpreted by the arrangement as an instruction to produce an interconnection list containing instructions to connect the pin designated D1 of a component A to the pin designated Dn of the component B, the pin designated D2 of a component A to the pin designated D(n−1) of component B and so on until pin Dn of component A is connected to pin D1 of component B. Thus the possibility of generating erroneous connection information is reduced provided that the correct component descriptions have been entered into the component library. The input description may alternatively, if appropriate for the particular components, be $$D[1:n].A, D[1:n].B; \qquad (2)$$

which is interpreted in a similar manner, the difference being that pins on component A are connected to corresponding pins on component B. Further the description $$D[1:n].A, D[m:n+m].B; \qquad (3)$$

is interpreted as connecting n pins of component A to n pins of component B on a one to one basis but with the pin numbers offset by m. It is not permissible to specify a different total number of pins on Component A with respect to Component B.

It may also or alternatively be desired to connect a plurality of pins on component A to a single pin on component B or vice versa. In a further form the invention enables the use of a simple interconnection description by allowing the entry of a component interconnection description in the form $$X[1:n].A, Y.B; \qquad (4)$$

This description would be interpreted by the arrangement as an instruction to produce an interconnection list containing instructions to connect n pins designated X on component A to the pin designated Y on component B. This is the only condition under which unequal numbers of pins to be connected on the two components are allowed.

A further interconnection requirement which frequently occurs is to connect pins of n components of type A to pins of m components of type B where n and m are integers which may be equal or unequal. In a still further form the invention enables the use of a simple interconnection description by allowing the entry of a component interconnection description in the form $$X.A[1:n], Y.B[1:m]; \qquad (5)$$

This description is interpreted by the arrangement as an instruction to produce an interconnection list containing instructions to connect pin X on n components of type A together and to pin Y on m components of type B.

The description (5) may be combined with any of the descriptions (1) to (4) and the combined description will be interpreted accordingly by the arrangement and the appropriate interconnection list generated. The above explains the interconnection of two arrays of components; in similar way the chaining three or more arrays of components may be expressed by concatenation of the expressions herebefore, such as:

$$X[a:b].A[c:d], Y[e:f].B[g:h], Z[i:j].C[k:l];$$

The invention further provides a method of generating component interconnection lists for an electrical circuit in the form of an individual component pin to individual component pin instruction comprising: forming a circuit interconnection description of the form $$X[a:b].A[c:d], Y[e:f].B[g:h];$$

where
X and Y are component pin function descriptions,
A and B are component names,
a, b, c, d, e, f, g, and h are integers which may take any value provided that the difference between a and b is equal to the difference between e and f unless either of those differences is equal to zero in which case the other may take any value,
and the comma represents "is connected to";
forming a list of components used and a description of those components; storing a library of standard components descriptions; and processing the circuit description and selected component descriptions from the library to produce an interconnection list in the form of an individual component pin to individual component pin connection.

The method may further include the step of declaring all components and named signals prior to processing the circuit description.

BRIEF DESCRIPTION OF THE FIGURES

An embodiment of the invention will now be described, by way of example, with reference to the accompanying drawings, in which.

DESCRIPTION OF AN EMBODIMENT OF THE ARRANGEMENT

Figure 1:
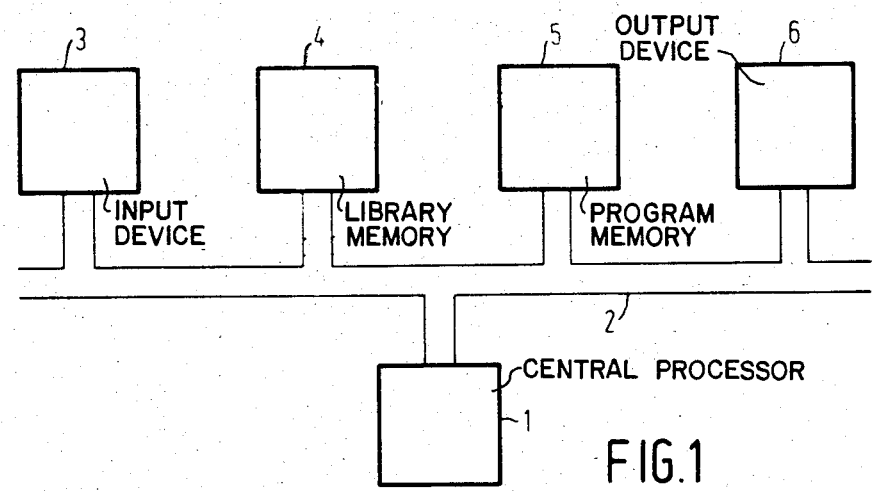
FIG. 1 shows in block schematic form an arrangement for generating component interconnection lists according to the invention.

FIG. 1 shows an arrangement for generating lists of component interconnections comprising a central processing unit 1 which is linked via a bus 2 to input means 3, a library 4, a program store 5, and output means 6. The input means may take any convenient form, for example a keyboard or a paper tape reader. The output means may take many forms depending on the use to which the information is to be put, for example a printer where the interconnection is to be made manually such as by wire wrapping or where the information is to be manually introduced into a computer aided circuit layout package. Alternatively the information could be transferred directly to a computer aided circuit layout package over a data link or could be transferred using any suitable intermediate storage medium such as paper or magnetic tape. The library 4 is a store containing details of the components used i.e. size, shape, number of pins and functions of each terminal or pin. The program store 5 contains instructions for the central processing unit 1 to enable the required output information to be generated from the input information. Although the arrangement in FIG. 1 is shown as a single-purpose arrangement; certain other tasks could also be executable thereon, however.

Figure 2:
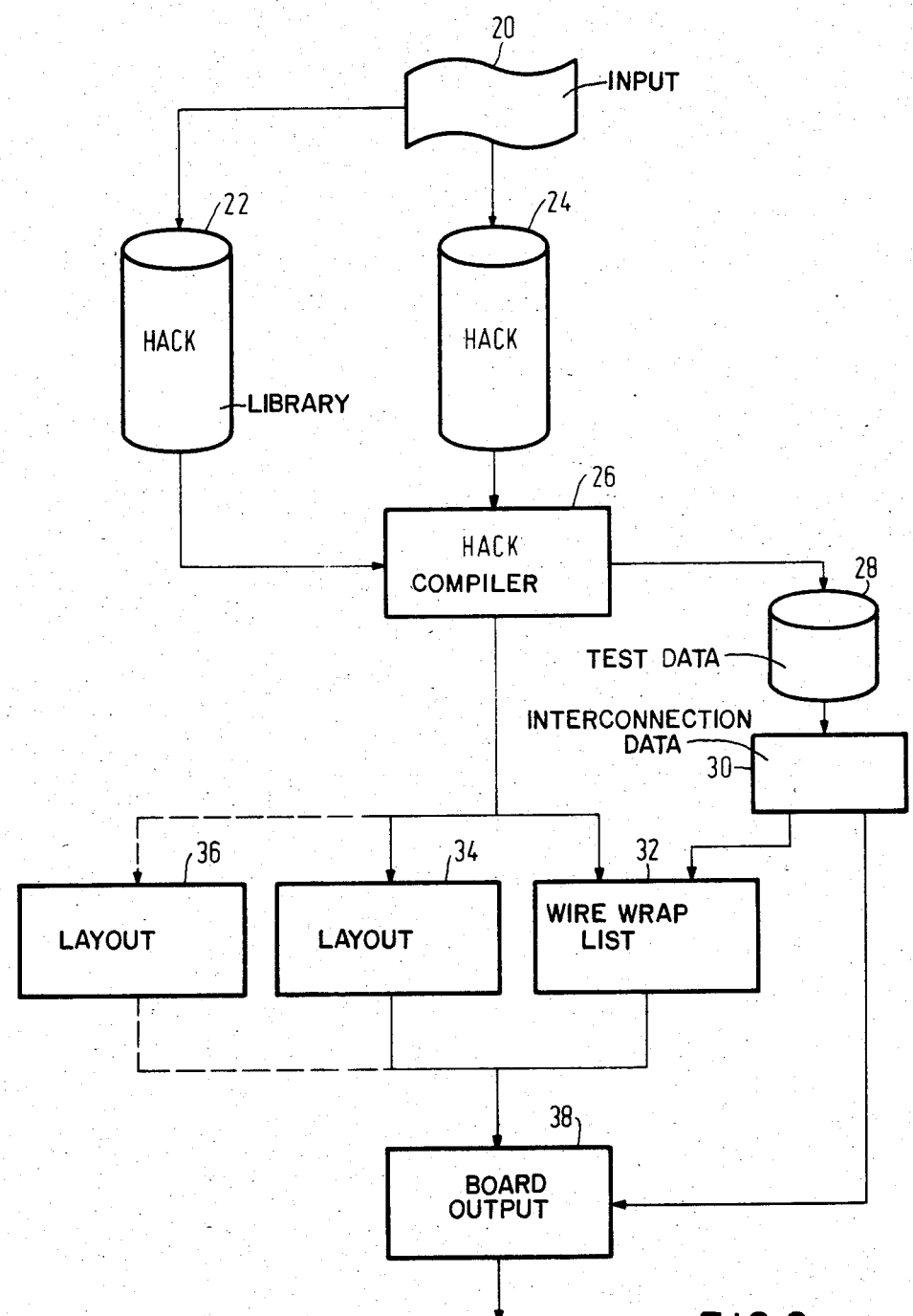
FIG. 2 shows the process of generating a circuit board layout.

FIG. 2 shows, in the form of an arrangement of modules the process of generating a circuit board layout; reference is still be had to FIG. 1. Now, a suite of programs stored in program memory 5 is used to enable the arrangement to generate lists of component interconnections. Input means 20 contains component descriptions which are forwarded to module 22 and connection specifications which are forwarded to module 24. Module 26 is fed by both modules 22 and 24. In module 26, one of the programs, called CHOP enables the designer to rapidly convert a circuit diagram (fed from module 20) into a form compatible with the input format of a commercially available printed circuit board (PCB) design system. A second program, called "Trace" assists in the construction of wire-wrapped prototypes and the debugging of the finished card.

Using the system, designated HACK (Hardware Compilation Kit) the designer is able to describe the circuit interconnection in a high level language syntactically similar to the C programming language. The input language allows component reference by functional name, and includes facilities to simplify the description of repetitive component and interconnection circuit structures, such as arrays and buses. The library of standard components is available in module 22, the source code of the HACK language is present in module 24. The function of module 26 is that of a compiler; generally compilers are well-known in the art of data processing. If necessary, the designer may update the library (module 22). The compiler (module 26) generates a file of pin connections that may be input into the further modules. In this respect, module 34 represents the commercially available REDAC (see hereabove) printed circuit board layout service.

To aid in the debugging of boards copiler module 26 also produces a list of any pins the designer may have left unconnected; also, a pin diagram of all discrete parts referenced in the source code is made available for display. This module furthermore generates a connection tally file which shows the number of connections between various pairs of components. Especially in a computer aided design system this may be used in placing the discrete elements. Those pairs having a high number of interconnections are by preference placed close together.

Module 28 is addressed by module 26 and contains test data. For example, in case of a memory component here a number of test patterns of known "difficult" character are stored.

The HACK input language is block-structured and in many respects a hybrid of the popular "C" and Pascal programming languages. These languages have been well-published and are available in the art of programming. The overall programming is like the language C, with the use of curly brace characters "{}" as block delimiters and C-like preprocessor commands and comments. The one principle deviation from this style is the use of a Pascal-like "with" construct to simplify the description of circuit areas that contain frequent reference to a particular component or component array.

Module 30 receives the test data from module 28; furthermore, this module (TRACE) traces all interconnections made for a particular board. It produces an output file for assisting the wire-wrapping. Module 32 is addressed by modules 26 and 30 and generates the instructions for wire-wrapping in the form of lists of items (from-to connections). Alternatively, module 26 may address module 34 containing the RACAL REDAC pcb layout service package referenced hereabove. Alternatively, another layout service package symbolized by module 36 could find application. Outputs of modules 34, 36 would also be in the form of from-to interconnection lists, where the actual interconnection could be made by hand or automatically.

Module 38 symbolizes the actual board manufacture operation as governed by the connection instructions from either of modules 32, 34, 36, or furthermore the test operation under control by test generating module 30. The output of module 38 is a series of finished boards, either accepted or rejected. The general idea of FIG. 2 is to show the interconnection of the respective process modules: the routing of the boards during execution of module 36 is not shown. Neither are shown the respective output formats of data such as video displays, hard copies by printers or control tapes either punched or magnetic.

DETAILED DESCRIPTION OF THE REALIZATION

The HACK description of a circuit starts with a header of the form:

board Example [euro-card]

giving the board the name "Example" and describing to a PCB design system, such as the RACAL REDAC Mini/Maxi PCB Design System, the board's physical dimensions by reference to a layout library description contained in the library 4. This is followed by the component and interconnection descriptions, enclosed within a pair of curly braces. Instructions for labelling the final printed board with its name and date of compilation man be automatically generated. Three types of block are permissible in describing the circuit: component description blocks, library blocks, and interconnection blocks.

Component description blocks relate a generic component type to the physical shape and pinout discriptions stored in the layout system's library. It also describes the mapping of the symbolic pin descriptions onto the actual pin numbers. This is analogous to the definition of a data structure in the C programming language—thus:

```
struct 2114
/*
1024 × 4 bit Static RAM.
*/
{
shape = L3004;
1 = A6 ; 18 = +5v ;
2 = A5 ; 17 = A7 ;
3 = A4 ; 16 = A8 ;
4 = A3 ; 15 = A9 ;
5 = A0 ; 14 = D0 ;
6 = A1 ; 13 = D1 ;
7 = A2 ; 12 = D2 ;
8 = CS/ ; 11 = D3 ;
9 = GND ; 10 = WE/ ;
}
```

Herein, 2114 is a type number to INTEL Corporation. L3004 is a shape name. The input language is completely free format, statements are terminated by a ";" character. Comments are contained within a "/*" "*/" pair and may be inserted at any point within the code (except within identifiers and other comments), and are replicated in the PCB layout description so that they may be used to identify particular interconnection blocks, or give layout staff special instructions.

All components must be declared prior to use. The process of component declaration is used to assign the component a functional name relevant to its use in the design thus:

struct elem inverter=7404;

This declares one component of type "7404" and gives it the name "inverter"; herein, 7404 is a type number in the well-known series of TTL IC components to Texas Instruments and other sources. A more advanced component declaration is:

struct elem video_RAM[1:4]=2114;

which defines an array of four video RAMs (Random Access Memories) called RAM1, RAM2, RAM3 and RAM4 each of which is of type 2114. Arrays need not only consist of numbers:

struct elem video_RAM[A:D]=2114;

would also create an array of four RAMS called RAMA, RAMB, RAMC and RAMD.

Alternatively the declaration may be combined with the generic description, such as:

```
struct Electrolytic_Capacitor
{
shape = L3546;
1 = + ;
2 = − ;
}smoothing_capacitor ;
```

To avoid the repeated description of commonly used components, with the attendant risk of error, reference to one or more libraries is permitted in the component declaration:

```
library 74_series_TTL
{
elem selector = 74138 ;
elem inverter = 7404 ;
}
``` libraries contain component descriptions identical to those shown hereabove, and may be compiled separately.

Circuit interconnections are described in interconnection blocks delimited by curly braces. The connections within a block are presented to the layout package as a block to enable the distinction of different types of signal, for example signals, power, ground, buses, and varying track widths. The first statement of a connection block may be a track width specifier, which determines the track width used for the remainder of the block. For example trackwidth=7;

The trackwidth statement may omitted, in which case the compiler picks a sensible default value.

A pin is referenced by means of a pin name and a component name, separated by a dot. The identifier:

Q1/.flip_flop therefore refers to the Q1/pin of a previously declared flip-flop package. Note that the use of the slash character to denote active low signals is a convenient convention for peripherals that do not support overscoring. Interconnections are made by listing pin identifiers as follows:

Q1.inverter, E3.selector;

This causes the compiler to generate output to connect the Q1 pin of the inverter to the E3 pin of the selector. The list may contain any number of chained interconnections and may be continued on as many lines as required, a semicolon terminating the chain. A1.inverter, E3.selector, D1.flip_flop;

An array of pins may be connected automatically by the use of the pin range notation, thus A[0:9].RAM, Q[1:10].buffer;

which would connect the 10 address pins of the device called RAM to the 10 output lines of the device called buffer, on a one to one basis. This dramatically reduces the amount of effort required to specify bus interconnection. The pin range notation may also be used to specify a multipin to single pin interconnection of the form:

D[1:5].buffer, Q1.inverter;

which would connect all 5 buffer input pins to the single output pin of the inverter. In the case of unequal connection ranges, with one of the ranges not equal to one, a compiler error message is generated.

The use of range notation may equally be applied to the interconnection of component arrays, and indeed the two range formats may be combined:

A[0:9].video_RAM[1:4], Q[1:10].buffer;

This statement would connect the RAM address pins to the buffer output pins on a one to one basis for the whole RAM array. One normally error prone task is the interconnection of two signal buses with the connection order of one inverted—this is simply achieved by the use of the pin range notation with the pin range order reversed in one of the cases.

A[0:4].RAM, D[4:0]. buffer;

This example would connect address 0 of RAM to input 4 of buffer, etcetera.

A second multiple component specification is the asterisk notation, in which an "*" character may be use in the place of one or more component names to mean "all applicable components". Usually, this asterisk is then preceded by a dot. The code +5 v.Connector_J3, +.smoothing_capacitor, +5 v.*; would be sufficient to specify the interconnection of the +5 volt supply for the entire card.

The inclusion of a "with" construct in the HACK input language simplifies the circuit specification when a large number of connections are being made to a particular component or component array. The semantics of this statement are similar to that employed in the Pascal programming language. Throughout the following block, any pin without a component name will be treated as belonging to the component (or component array) specified in the "with" clause. Codes of the form

```
with RAM[1:4]
{
Q[0:9].buffer, A[0:9];
CS/ , 1/.selector ;
{
``` would create interconnections making the assumption that pins A[0:9] and CS/ belonged to the array of four devices called RAM[1:4]. The "with" statement can be a powerful structuring tool as designers tend to work around the board generating "with" statements for each major component in the circuit. Nested "with" statements are not permitted.

It is frequently the case that the designer wishes to assign to a signal a logical name, and arrange to connect the pins of various components to that named signal. Another familiar problem is that of interconnecting the boundary signals arising through the partitioning of a circuit diagram over a number of sheets of paper. HACK provides a solution to this problem by the use of so called "external" signals. These are denoted in the circuit description by prefixing the signal identifier with a tilde ("~"). Pins are connected to the external signals in the conventional manner:

```
A1.RAM1,~address1 ;
 .
 .
~address1, Q1.buffer ;
```

The compiler is able to resolve any previously omitted connections at link time by generating a list of external signal interconnections. Prior to use, these signals must be declared by the use of an extern statement:

```
extern
address[0:7], GND, VCC ;
```

Note that the usual pin range construct is equally valid for externals.

To permit the use of symbolic constants in the HACK circuit description, and to enable the designer to split the design over a number of files, a C-like preprocessor is provided. Two types of command may be issued to the preprocessor: ≠define causes the preprocessor to perform a textual substitution of one symbol for a string of symbols.

```
≠define RAM_ARRAY 0:4
struct elem video_RAM [RAM_ARRAY] = 2114 ;
```

This has the effect of replacing the symbol "RAM_ARRAY" with the string "0:4" throughout the remainder of the code. The substitution text can be any sequence of characters up to the end of the line. This instruction may be useful where a particular group or array of components is frequently referred to and an alteration is made to the number of components in the group or array. In that case only the ≠define instruction has to be amended the corresponding changes being made automatically throughout the program.

The other preprocessor directive is ≠include, which causes the specified file to be included into the main program at the specified point.

```
≠include "videocircuit"
enable.RAM [RAMARRAY],~GND ;
```

Figure 3:
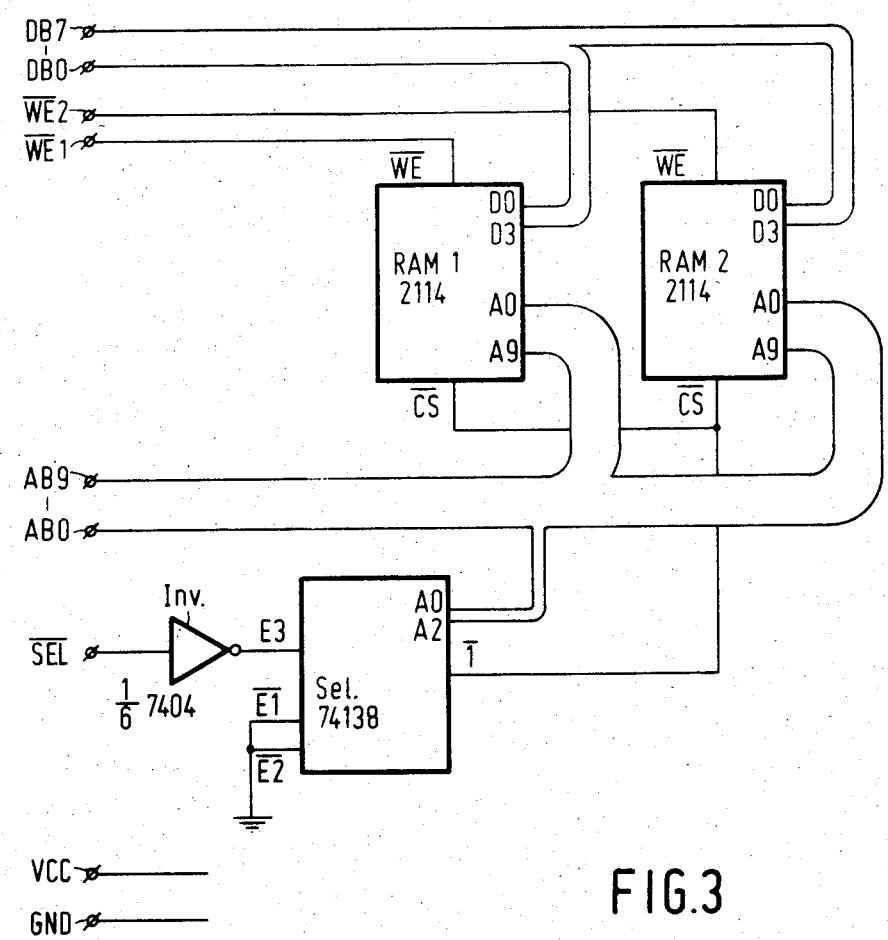
FIG. 3 shows a circuit diagram of an electrical circuit for which a component interconnection list is to be generated.

To illustrate the use of the language in the discription of a design, a simple circuit diagram is shown in FIG. 3, and its corresponding HACK program is given in Appendix 1. Since many of the examples used in this description are taken from the Appendix the relationship between the conventional circuit diagram and its HACK description will be clear.

HACK is capable of producing a number of useful output files in addition to the one containing the code required as input to the PCB layout package. In the event of an error in the source code an error listing can be produced, which may be either a short summary of the errors, or a more traditional program style listing showing the errors in context.

A list of unconnected pins may be produced to assist the designer in determining the completeness of the circuit description and references the unconnected pin by its true component number and pin number as well as by its HACK name as used in the source code may be made. The component generic type may also indicated. The component number is a number allocated to each component by HACK for reference on the PCB, circuit, and other documentation. This numbering conforms to the traditional numbering style (i.e. IC1, TR1, R22), but the styles can be changed if necessary.

A component list can be produced for use in the fabrication and documentation of the board and a "tally" file may be produced showing the number of connections between each component and all other components in the circuit. The latter is of particular use during the construction of prototype circuits, where it is of assistance in the placement of the components.

A picture file can be produced showing the pinout of all the integrated circuits used (shown from both sides of the board) for use in debugging. The compiler can also make available an intermediate code file showing the generated interconnections, alongside the expanded source code that generated it. This is used by the trace utility, but may also be of use to other post processing utilities. The final file produced contains the HACK output used in the actual generation of the board.

Part of the code generated by the compiler from the source code in Appendix 1 for a Racal REDAC PCB layout systems is shown in Appendix 2. As an alternative, the user may request the code generator in HACK to produce a series of wire-wrap instructions for a wireperson to be used in the construction of a prototype circuit. These instructions list the connections in terms of component and pin numbers, and also suggest a suitable wire colour. Modified versions of HACK may be used to generate code for other layout systems.

Trace is a utility used in conjunction with the HACK system to trace connections. Trace examines the HACK intermediate code file and enables the designer to display interactively the physical interconnections produced from the HACK code. The program will tell the designer which pins of what other components are connected to a given pin, understanding component number, pin number and HACK symbolic descriptions. In order to assist in the identification of the interconnection on wire-wrapped prototype boards, the wire colour given in the wireperson's instructions is also shown. This makes life much easier when the designer and constructor are not the same person.

HACK is written in the C programming language and can be inplemented, for example under the CP/M (in BDS-C for the 8080/Z80), UNIX, and VAX/VMS operating systems. Porting the package to other operating systems would be a relatively simple exercise given the availability of an adequate C compiler. The object code of the largest overlay of the HACK compiler occupies about 60K bytes on an ONXK C8002 UNIX system. The restrictions that UNIX V7 place on the size of an image's data space limits the size of board that can be compiled. It is anticipated that a future switch to the UNIX System III operating system, or the recompilation of the program suite with the VAX11-C compiler on a VAX11/780 will result in a version of the compiler that places no reasonable restriction on the size of circuit that can be compiled.

It should be noted that throughout the description and Claims the symbols use are purely arbitrary and other symbols could be used depending on those available on the precise apparatus used, e.g. input keyboard and output printer. It would be obvious that other languages or other constructs could be used to realize the invention. The following advantageous points of the invention are summarized:

- there is an automatic array connect construct; especially when bus structures are of a one-to-one plus offset nature this is an elementary solution. Notably, the language is data-oriented, and not an imperative language such as Lims's.
- the present system allows for a later assigning or wild card connection.
- the "with" statement has found a very practical as users have been found to often describe circuits in terms of clusters of component connected to a central main component.
- the preprocessor provided allows for symbolic substitution, which can be parametrised in a later release, and to include text files in inline code. Especially, the "if" statement is introduced in this way. There is no need for an "if" statement to be built into the language.
- the library facility, by means of the referenced preprocessor, allows for a simple and flexible operation of the system; this advantage is enhanced in that the syntaxes of program and library are identical.
- the system can be provided with a trackwidth command. Also, comments may be fed through to the final output to act as instructions to the personnel executing the layout/assembly proper.
- a wire-wrap colour coding may be used.
- the trace facility has been found advantageous.
- the system provides for external signals, that are signals with no associated component.
- the combination of the two well-known programming languages has been found advantageous, although other languages could also be used. Specifically, the system set-up is such that no high-skill requirements are necessary for its operation.

Appendix 1

```
board Example euro_card
{
library 74TTL
{
elem selector = 74138;
elem inverter = 7404 ;
}
struct 2114
/*
1924 × 4 bit Static RAM
*/
{
shape = L3004 ;
1 = A6 ; 18 = +5v ;
2 = A5 ; 17 = A7 ;
3 = A4 ; 16 = A8 ;
4 = A3 ; 15 = A9 ;
5 = A0 ; 14 = D0 ;
6 = A1 ; 13 = D1 ;
7 = A2 ; 12 = D2 ;
8 = CS/ ; 11 = D3 ;
9 = GND ; 10 = WE/ ;
}RAM [1:2] ;
extern
AB[0:9], DB[0:7], sel/, WE/[1:2], GND, VCC ;
connections SIGNALS
{
trackwidth = default ;
```

Appendix 1-continued

```
with RAM [1:2]
{
~AB[0:9], A[0:9] ;
CS/ , 1/.selector ;
}
with RAM [1]
{
~DB[0:3], D[0:3] ;
~WE/[1], WE/ ;
}
with RAM [2]
{
~DB[4:7], D[0:3] ;
~WE/[2], WE/ ;
}
with selector
{
E1/, E2/, ~GND ;
A[0:2], ~AB[0:2] ;
}
~sel/, D1.inverter ;
Q1.inverter, E3.selector ;
}
connections POWER
{
trackwidth = default ;
~VCC, +5v* ;
}
connections GROUND
{
trackwidth = default ;
~GND, GND.* ;
}
}
```

Appendix 2

```
.PCB REDAC SHAPE FILE GENERATED BY CHOP V7.00
.REM INVOKED ON MON OCT 17 16:29:05 1983.
.TEXT
.CODE 1
EXAMPLE 17/10/83
.BOARD EURO_CARD
.COM
.REF
IC1 L3003
IC2 L3002
.REM
.REM 1024 × 4 BIT STATIC RAM
.REM
.COM
.REF
IC3 L3004
IC4 L3004
.EOD
.PCB REDAC CONNECTION FILE GENERATED BY CHOP
.CON START OF SIGNALS CONNECTIONS
.CODE 2
IC3 5 IC4 5
IC3 6 IC4 6
IC3 7 IC4 7
IC3 4 IC4 4
IC3 3 IC4 3
IC3 2 IC4 2
IC3 1 IC4 1
IC3 17 IC4 17
IC3 16 IC4 16
IC3 15 IC4 15
IC3 8 IC4 8
IC3 8 IC1 14
IC1 4 IC1 5
IC2 2 IC1 6
.CON START OF POWER CONNECTIONS
.CODE 6
IC1 16 IC2 14
IC1 16 IC3 17
IC1 16 IC4 18
.CON START OF GROUND CONNECTIONS
.CODE 7
IC1 8 IC2 7
```

Appendix 2-continued

```
IC1 8 IC3 9
IC1 8 IC4 9
.REM CONNECTING EXTERNAL SIGNALS
IC1 4 IC1 8
IC1 1 IC4 5
IC1 2 IC3 6
IC1 3 IC3 7
.EOD
```

We claim:

1. An arrangement for generating a component interconnection list for an electrical circuit, each interconnection being in the form of a link between a first individual component pin and a second individual component pin, said arrangement comprising means for entering a component list containing any component used, a component description of any component used inclusive of a functional pin description thereof, and a circuit interconnection description containing elements of the form of a first array of pins of a second array of named components connected to a third array of pins of a fourth array of named components, at least one array being non-unitary, wherein for any circuit interconnection description element in which both said first and said third arrays are non-unitary the first and third arrays have equal numbers of array elements, said arrangement furthermore containing library means for storing said component descriptions as standard component descriptions, processing means for processing, under program control, the circuit interconnection description and the list of components used while addressing said library means for accessing said component descriptions, and output means for after said processing outputting said component interconnection list.

2. An arrangement as claimed in claim 1 wherein at least one circuit interconnection description element has at least one indirect assignment (with) description block containing a Pascal language type "with" statement with respect to a fifth component array for thereto assigning a description for thereupon processing this fifth array by the processing means on the basis that any pin without an associated specified component in the circuit interconnection description is contained within said fifth array.

3. An arrangement as claimed in claim 1 or 2 wherein said circuit interconnection description further contains at least one element in the form of a sixth array of equally named pins of any component to be connected to an associated common point in the electrical circuit.

4. An arrangement as claimed in claims 1 or 2, wherein said entering comprises a declaration of all components and named signals by listing them and assigning signal names to the pins thereof prior to activating said processing means for processing the circuit description.

5. An arrangement as claimed in claims 1 or 2, in which the processing means are controlled for executing a predetermined instruction to replace a first description by a second description wherever the first description occurs.

6. An arrangement as claimed in claims 1 or 2 in which the processing means are operative for under control of a second predetermined instruction inserting the contents of a specified file at a predetermined position within the program.

7. An arrangement as claimed in claims 1 or 2, wherein said output means are visualising output means.

8. A method of generating component interconnection lists for an electrical circuit in the form of an individual component pin to individual component pin instruction comprising forming a circuit interconnection description of the form $$X[a:b].A[c:d], Y[e:f].B[g:h];$$

where

X and Y are component pin function descriptions,

A and B are component names, a, b, c, d, e, f, g, and h are integers or letters which may take any value provided that the difference between a and b is equal to the difference between e and f unless either of those differences is equal to zero in which case the other may take any value, and the comma represents "is connected to";

forming a list of components used and a description of those components; storing a library of standard component descriptions; and processing the circuit description and selected component descriptions from the library to produce an interconnection list in the form of an individual component pin to individual component pin connection.

9. A method according to claim 8, in which all components and signals are declared prior to processing the circuit description.

* * * * *